(12) United States Patent
Feurle

(10) Patent No.: US 6,317,374 B2
(45) Date of Patent: Nov. 13, 2001

(54) METHOD FOR OPERATING A CURRENT SENSE AMPLIFIER

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/742,133

(22) Filed: Dec. 20, 2000

(30) Foreign Application Priority Data

Dec. 20, 1999 (DE) .............................................. 199 61 518

(51) Int. Cl.[7] ....................................................... G11C 7/00
(52) U.S. Cl. ............................................. 365/205; 365/207
(58) Field of Search .................................... 365/205, 207, 365/208

(56) References Cited

U.S. PATENT DOCUMENTS

| | | | |
|---|---|---|---|
| 5,491,667 | * 2/1996 | Sharp | 365/205 |
| 5,502,680 | * 3/1996 | Du et al. | 365/205 |
| 5,615,161 | 3/1997 | Mu | 365/208 |
| 5,883,846 | 3/1999 | Lee | 365/207 |
| 6,002,626 | * 12/1999 | Lattimore et al. | 365/208 |

\* cited by examiner

*Primary Examiner*—Vu A. Le
(74) *Attorney, Agent, or Firm*—Herbert L. Lerner; Laurence A. Greenberg; Werner H. Stemer

(57) ABSTRACT

A method for operating a current sense amplifier having a latch configuration improves the signal-to-noise ratio by setting the supply voltage for the latch configuration to be greater than a voltage which is present at the input of the current sense amplifier.

2 Claims, 1 Drawing Sheet

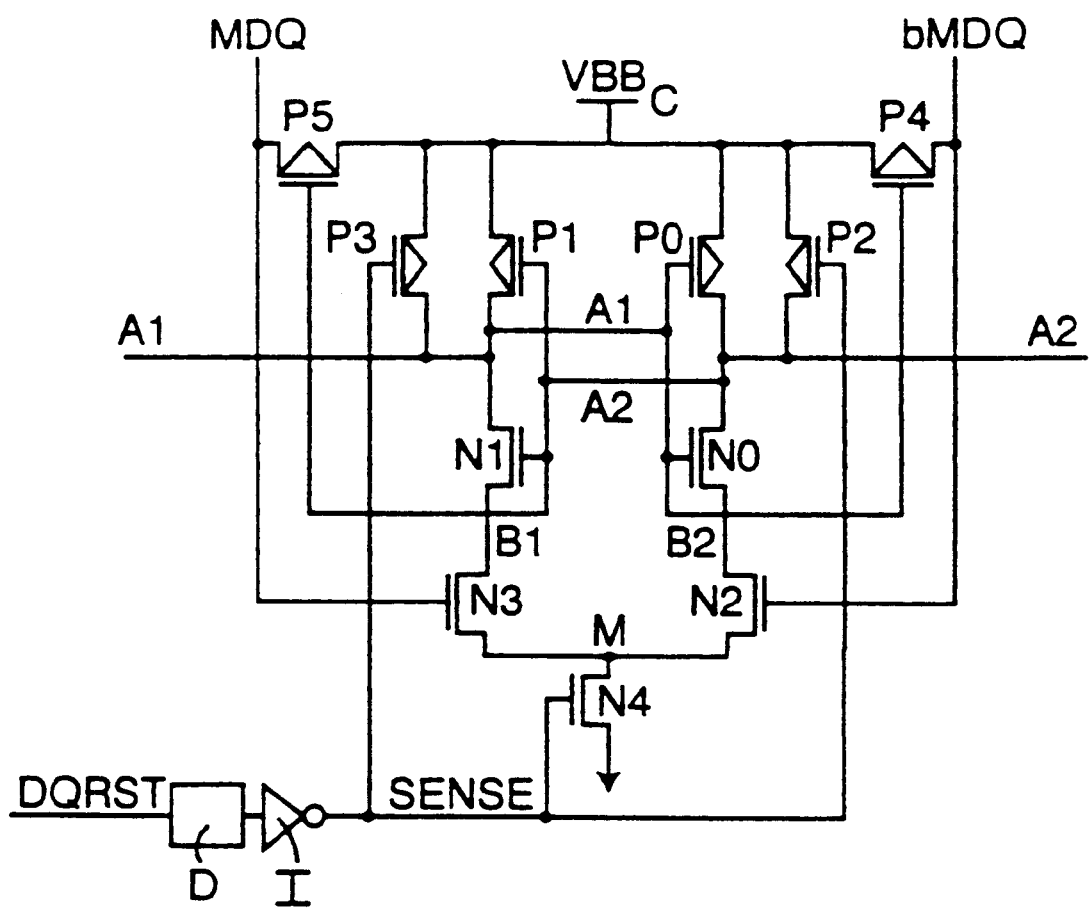

METHOD FOR OPERATING A CURRENT SENSE AMPLIFIER

BACKGROUND OF THE INVENTION

Field of the Invention

The invention relates to a method for operating a current sense amplifier having a latch configuration. A supply voltage is applied to the latch configuration. Transistors of the latch configuration are connected to one another via nodes and are connected to precharge transistors. The current sense amplifier has sense transistors which are connected downstream of an input and are provided between the latch configuration and an output stage. The precharge transistors are provided between the input and the supply voltage and are controlled via the nodes.

Such a current sense amplifier is conventional and has been in widespread use for a long time. The signal-to-noise ratio of such a current sense amplifier is in many cases still unsatisfactory which can be attributed to technological problems during the production of the current sense amplifier.

Specifically, as a result of technological process fluctuations, the nodes in the current sense amplifier may have different capacitances. This means that the nodes can discharge themselves even when identical voltages are present at them. This parasitic discharging process is dependent on the gate voltage applied to the sense transistors. In other words, there are voltage ranges in which the signal-to-noise ratio of the current sense amplifier drifts into unsatisfactory ranges.

In-order to overcome these difficulties, a relatively long waiting time has been used in the past to ensure that the signals applied to the gates of the sense transistors have been built up or developed sufficiently before actually switching the current sense amplifier on. It has also been suggested to use slower operating sense concepts. However, these approaches have been found to be cumbersome.

SUMMARY OF THE INVENTION

It is accordingly an object of the invention to provide a method for operating a current sense amplifier configuration which overcomes the above-mentioned disadvantages of the heretofore-known methods of this general type and which improves the signal-to-noise ratio in a simple manner.

With the foregoing and other objects in view there is provided, in accordance with the invention, a method for operating a current sense amplifier configuration, the method includes the steps of:

providing a current sense amplifier having an input, a latch configuration, precharge transistors, sense transistors, and an output stage, the latch configuration having transistors connected to one another via nodes and connected to the precharge transistors, the sense transistors being connected downstream of the input and being connected between the latch configuration and the output stage, the precharge transistors being controlled via the nodes and being connected between the input and a supply voltage;

providing the supply voltage to the latch configuration; and providing a given voltage at the input, the given voltage having a value at most equal to a difference between the supply voltage and a threshold voltage or switch-on voltage of p-channel MOS transistors of the latch configuration.

In other words, the object of the invention is achieved by setting the voltage which is present at the input to be lower than the supply voltage.

Thus, in the method according to the invention, the voltage which is applied to the gates of the sense transistors is never greater than the supply voltage for the latch configuration. The voltage which is present at the input is, optimally, not greater than the difference between the supply voltage and the threshold voltage of p-channel transistors in the latch configuration.

The method according to the invention thus allows a selection of the optimum voltages for supplying the latch configuration and the input of the sense transistors, so that a sense process can be carried out extremely quickly.

The voltage which is present at the input and the supply voltage for the latch configuration can advantageously be set separately from one another.

Other features which are considered as characteristic for the invention are set forth in the appended claims.

Although the invention is illustrated and described herein as embodied in a method for operating a current sense amplifier, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The single FIGURE is a circuit diagram of a current sense amplifier used for the method according to the invention.

DESCRIPTION OF THE PREFERRED EMBODIMENT

Referring now to the single figure of the drawing in detail, there is shown a current sense amplifier having a normal latch configuration with p-channel MOS transistors P0 and P1, and n-channel MOS transistors N0, N1. The gate of the p-channel MOS transistor P0 is connected firstly via a node A1 to the gate of the n-channel MOS transistor N0, and to the source-drain path of the transistors P1 and N1. In a similar way, the gate of the p-channel MOS transistor P1 is connected firstly via a node A2 to the gate of the n-channel MOS transistor N1, and secondly to the source-drain path of the transistors P0 and N0.

A p-channel MOS precharge transistor P3 is connected in parallel with the p-channel MOS transistor P1, and a p-channel MOS precharge transistor P2 is provided in parallel with the p-channel MOS transistor P0. The gates of the transistors P2 and P3 are connected to a sense node SENSE.

The latch configuration has a connection C to which a supply voltage VBB is applied. The p-channel MOS transistors P4 and P5, respectively, are connected between one input MDQ or bMDQ, respectively, of the current sense amplifier and the connection C, and their gates are connected to the node A1 or the node A2, respectively. The respective inputs MDQ and bMDQ are, furthermore, respectively connected to gates of n-channel MOS sense transistors N3 and N2, respectively, which are connected in series with the source-drain paths of the transistors P1, N1 (cf. transistor N3 with the node B1) or of the transistors P0 and N0 (cf. transistor N2 with the node B2), respectively. The transistors N2 and N3 are connected via a node M to an n-channel MOS transistor N4, whose gate is connected to the node SENSE.

The node SENSE is connected via an inverter I and a delay element D to an output DQRST.

The above configuration of the current sense amplifier is conventional.

As has already been explained in the introduction, process fluctuations during the production of the current sense amplifier can, for example, result in different capacitances being present at the nodes A1 and A2. This means that the nodes A1 and A2 can discharge themselves even when identical voltages are present on the sense transistors N2 and N3. This parasitic discharge process is in this case dependent on the gate voltage applied to the sense transistors N2 and N3, that is to say it is dependent on the voltage applied to the input MDQ and the input bMDQ, respectively.

In order now to keep this initial discharging of the nodes A1 and A2 as small as possible, the voltage which is applied to the respective input MDQ or bMDQ must not be greater than the supply voltage VBB at the connection C of the latch configuration. Specifically, if this condition is satisfied, this prevents the nodes A1 and A2 from discharging even if the capacitances of these nodes are different, since the leakage currents are minimized.

Optimum voltage conditions are present when the voltage applied to the respective input MDQ or bMDQ is not greater than the difference between the supply voltage VBB at the connection C of the latch configuration and the threshold voltage of the p-channel MOS transistors P0 and P1 in the latch configuration.

By selecting the optimum voltages for the supply for the latch configuration and the respective input MDQ or bMDQ of the sense transistors N3 or N2, respectively it is possible to have a sense process that takes place extremely quickly. The voltages at the respective input MDQ or bMDQ and the supply voltage VBB at the connection C can advantageously also be set separately from one another.

I claim:

1. A method for operating a current sense amplifier configuration, the method which comprises:

providing a current sense amplifier having an input, a latch configuration, precharge transistors, sense transistors, and an output stage, the latch configuration having transistors connected to one another via nodes and connected to the precharge transistors, the sense transistors being connected downstream of the input and being connected between the latch configuration and the output stage, the precharge transistors being controlled via the nodes and being connected between the input and a supply voltage;

providing the supply voltage to the latch configuration; and providing a given voltage at the input, the given voltage having a value at most equal to a difference between the supply voltage and a threshold voltage of p-channel MOS transistors of the latch configuration.

2. The method according to claim 1, which comprises setting the supply voltage and the given voltage independently of one another.

* * * * *